United States Patent [19]

Goto et al.

[11] Patent Number: 4,829,189

[45] Date of Patent: May 9, 1989

[54] APPARATUS FOR LOW-TEMPERATURE PLASMA TREATMENT OF SHEET MATERIAL

[75] Inventors: Tokuju Goto, Nara; Itsuo Tanaka, Osaka; Masakatu Takahashi, Kyoto; Yoshikazu Sando, Wakayama; Hiroshi Ishidoshiro, Wakayama, all of Japan

[73] Assignee: Sando Iron Works Co., Ltd., Wakayama, Japan

[21] Appl. No.: 71,889

[22] Filed: Jul. 10, 1987

[30] Foreign Application Priority Data

Jul. 18, 1986 [JP] Japan .................................. 61-169432
Jul. 18, 1986 [JP] Japan .................................. 61-169433
Jul. 18, 1986 [JP] Japan .................................. 61-169434

[51] Int. Cl.⁴ .................................................. G21K 5/02
[52] U.S. Cl. ........................... 250/492.3; 250/492.1; 250/453.1; 118/718; 118/50.1
[58] Field of Search ................ 250/492.3, 492.1, 453.1, 250/454.1, 455.1; 118/718, 719, 723, 724, 50.1

[56] References Cited

U.S. PATENT DOCUMENTS 3,924,563 12/1975 Kessler et al. ................. 118/724
4,437,324  3/1984 Sando et al. .................. 118/718
4,457,145  7/1984 Sando et al. .................. 118/718
4,601,260  7/1986 Ovshinsky .................... 118/718
4,619,667 10/1986 Ueno et al. .................... 427/41
4,649,860  3/1987 Furukawa et al. ............ 118/724
4,691,137  9/1987 Goto et al. ..................... 313/30

Primary Examiner—Carolyn E. Fields
Assistant Examiner—John A. Miller
Attorney, Agent, or Firm—Toren, McGeady & Associates

[57] ABSTRACT

An apparatus for low-temperature plasma treatment of a sheet material, comprising a plurality of reaction zones through which the sheet material is transported in an enclosed reaction chamber whose inner pressure can be reduced, in which the reaction zones are provided respectively with an electrode communicating to a high frequency generating device and a plurality of jet nozzles for supplying a gas thereto for generating low-temperature plasma gas, and the reaction chamber and the reaction zones are earthed. Another apparatus for the same purpose is to provide a liquid medium passage passing through the guide rolls for transporting a sheet material to be treated and through the electrodes under reduced pressure for heating or cooling the sheet material under treatment to a prescribed temperature. Further an electric energy feeding device for the electrodes comprising a shielded wire jointer having a cooling mechanism for connecting a shielded wire coming out of a high frequency generating device to the electrodes for generating low-temperature plasma.

2 Claims, 5 Drawing Sheets

APPARATUS FOR LOW-TEMPERATURE PLASMA TREATMENT OF SHEET MATERIAL

BACKGROUND OF THE INVENTION

1. Field of the Invention

The present invention relates to an apparatus for low-temperature plasma treatment of a sheet material such as a cloth and a film for improving the quality of the product obtained, particularly by controlling the temperature of the material in the course of treatment and including a feeding device of electric energy to the apparatus.

2. Description of the Related Art

It has been developed recently to subject a sheet material such as a long cloth and a long film produced commercially to low-temperature plasma treatment by transporting said sheet material through a reaction chamber in which low-temperature plasma is generated for improving the quality of the material treated. The mechanism of the conventional apparatus for low-temperature plasma treatment of a sheet material is to supply a gas for generating plasma into a reaction chamber provided with an electrode for generating plasma and to feed high frequency with a frequency of, for instance, 13.56 MHz to the electrode for generating low-temperature plasma in the reaction chamber. By transporting a sheet material through gas atmosphere thus excited with low-temperature plasma, the plasma treatment in object can be accomplished.

However, in such a conventional apparatus for low-temperature plasma treatment of a sheet material, there have been shortcomings in such points as the efficiency of generating low-temperature plasma, the quality low-temperature plasma gas generated and its utilizing efficiency. Namely, while it is possible to generate low-temperature plasma in the reaction chamber, low-temperature plasma gas utilized practically for the treatment of a sheet material passing through the reaction chamber is only a part of the gas generated and the remainder of the gas is usually abandoned in vain, thus deteriorating the utilization efficiency of the plasma or, in other words, the utilization efficiency of electric power for generating high frequency. Further, in a conventional apparatus for low-temperature plasma treatment in which a long sheet material is transported continuously therethrough a large amount of external atmosphere (air) is penetrated into the reaction chamber unavoidably due to the incompleteness of the seal mechanism thereof and the amount of by-product gas contaminated therein is increased unavoidably. As a result, there is a drawback that a large amount of by-product gas is absorbed on the surface of the sheet material, thus lowering the efficiency of treatment.

Moreover, when there occurs a temperature change in the course of continuous low-temperature plasma treatment of a sheet material, particularly in the case of a textile product such as a cloth, the quality of the textile product after treatment is deteriorated due to the fluctuation of the treating temperature thereof, and in some instances when the temperature of the textile product is apart from the desirable treating temperature, the treatment in object cannot be done satisfactorily. Therefore, it is desirable in such a case that the temperature of a textile product passing through the low-temperature plasma gas atmosphere in a reaction chamber is constant at a suitable prescribed temperature through the period of treatment. In such a reaction chamber, however, such parts as guide rolls, electrode plates and walls in a reaction chamber are heated naturally in the progress of the treatment, and the heat thus accumulated is transmitted directly and/or indirectly to the textile product unavoidably. As a result, the temperature of the textile product is also elevated, and accordingly, the low-temperature plasma treatment thereof becomes non-uniform, causing the difficulty that treatment in object cannot be attained satisfactorily.

Separately, in subjecting a broad sheet material (for instance with a width of 90 to 180 cm) to low-temperature plasma treatment, a large size reaction chamber with a large size electrode is necessitated, and the leakage of plasma is easily caused to occur unavoidably due to the discharge between the feed wire and the electrode, causing a shortcoming that a large amount of energy must be consumed. For the purpose to depress such an energy loss, it is effective to transmit electric current by connecting a high frequency generating device outside of the reaction chamber and an electrode for generating low-temperature plasma in the reaction chamber with the use of a shielded wire (i.e., coaxial cable). However, since the insulating layer around the lead wire of a shielded wire comprises usually a resin with low heat-resistivity such as polyethylene, the heat accumulated in said electrode (to about 100° C.) during treatment is transmitted to said shielded wire for heating it, and consequently, there occurs a difficulty that the insulation of said shielded wire is frequently broken due to the fusion of the insulating layer thereof which is consisted of a low heat resistive material such as polyethylene.

SUMMARY OF THE INVENTION

In view of such circumstances, the primary object of the present invention is to offer an apparatus for low-temperature plasma treatment of a sheet material in which the contamination of by-product gas in low-temperature plasma gas generated in the reaction chamber is prevented and the thus generated high quality low-temperature plasma gas is supplied directly to a sheet material for elevating the efficiency of plasma treatment and the quality of the product. The second object of the invention is, in such an apparatus, to reduce the amount of low-temperature plasma gas generated outside of the zone of transporting a sheet material as well as said gas abandoned to the exterior of the apparatus for increasing the utilization efficiency of low-temperature plasma gas and further for sparing the consumption of electric energy. The third object is to offer an apparatus in which the temperature of guide rolls for transporting a sheet material as well as the electrode for generating low-temperature plasma in the reaction chamber is controlled to a prescribed value for maintaining the temperature of the sheet material running through the reaction chamber to a desirable temperature so as to produce a product with a uniform and excellent quality. Finally, the fourth object is to offer an excellent feeding device of electric energy to the inventive apparatus for low-temperature plasma treatment of a sheet material.

An apparatus for low-temperature plasma treatment of a sheet material chiefly to answer the primary and the second objects in the present invention comprises, to say in short, providing a plurality of reaction zones through which a sheet material to be treated is transported in an enclosed reaction chamber whose inner pressure can be reduced, in which said reaction zones being provided respectively with an electrode communicative to a high frequency generating device outside of the reaction chamber and a plurality of jet nozzles for supplying a gas for generating low-temperature plasma, and said reaction chamber and said reaction zones being earthed. Details of the apparatus of this type will be illustrated in Example 1 as will be described hereinafter.

Another apparatus for low-temperature plasma treatment of a sheet material, which is particularly fitted for the purpose to answer the third object of the invention and will be illustrated in detail in Example 2 in the following, may be summarized as follows: A plurality of guide rolls for transporting a sheet material therethrough, a plurality of electrode plate pairs in which a passage of the sheet material thus transported is provided respectively therebetween, a liquid medium passage passing through said guide rolls and in adjacent to said electrode plate pairs for heating or cooling them, and a means for controlling the temperature of said guide rolls and said electrode plate pairs to a prescribed temperature by passing a liquid medium through said passage are provided in an enclosed reaction chamber in which low-temperature plasma can be generated under reduced pressure.

An electric energy feeding device for one of the apparatuses for low-temperature plasma treatment of a sheet material mentioned in the above and to meet with the fourth object of the invention comprises connecting a shielded wire coming out of a high frequency generating device to an electrode for generating low-temperature plasma provided in a reaction chamber electrically by putting a shielded wire jointer provided with a cooling mechanism therebetween. Details of this device will be illustrated in Example 3 in the following.

In applying the present inventive apparatus, low-temperature plasma treatment of a sheet material such as a textile product and a film can eminently and effectively be done.

BRIEF EXPLANATION OF THE DRAWINGS

FIGS. 1 to 3 relate to a present inventive apparatus in Example 1 as will be described in the following. In which, FIG. 1 is a drawing to explain the outline of its construction, FIG. 2 is to explain the construction of its reaction zone, and FIG. 3 is the front view of said reaction zone.

FIGS. 4 and 5 relate to an apparatus in Example 2, in which FIG. 4 is a drawing to explain its construction, and FIG. 5 is an explanatory drawing showing particularly its liquid medium passage.

FIGS. 6 to 9 relate to a feeding device of electric energy in Example 3, in which FIG. 6 is an oblique figure to show an electrode provided with the feeding device, FIG. 7 is a front view of its essential parts, FIG. 8 is a sectional view to explain a shielded wire jointer, and FIG. 9 is its front view.

DETAILED DESCRIPTION OF THE PREFERRED EMBODIMENTS

Figure 1:
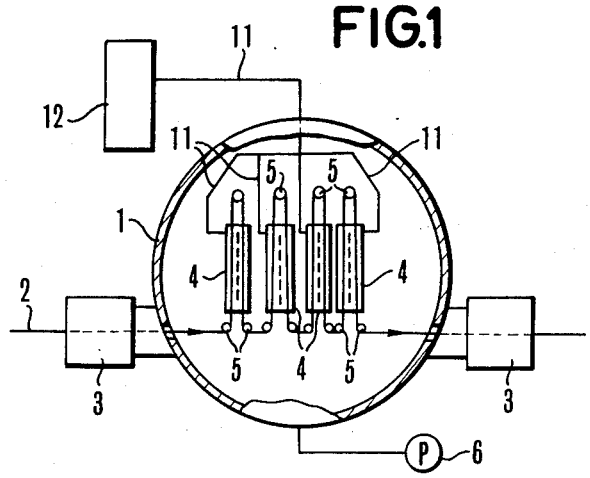

Now, preferred embodiments of the present invention will be described in detail in the following based on the examples of the inventive apparatus as shown in the drawings.

EXAMPLE 1

Figure 2:
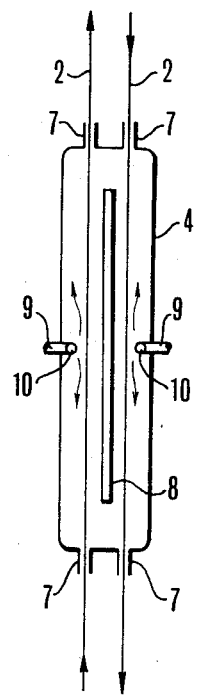
Figure 3:
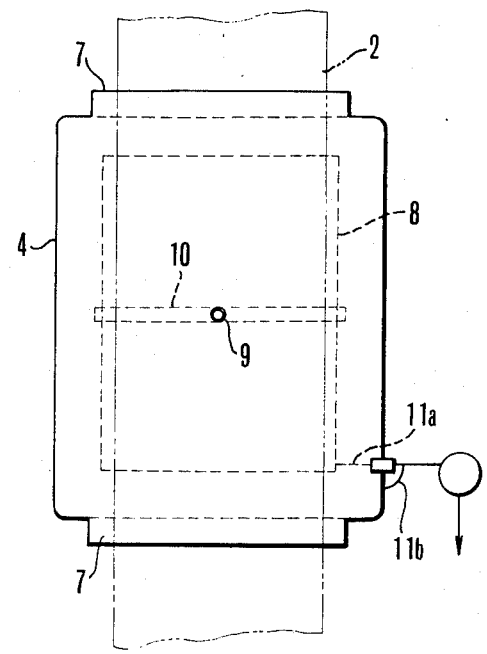

An example of the present inventive apparatus for low-temperature plasma treatment of a sheet material shown in FIGS. 1–3 is for the treatment in continuous type under reduced pressure.

In FIG. 1, 1 is a reaction chamber under severely reduced pressure. 2 is a long sheet material to be treated such as a cloth, a non-woven fabric and a film. 3 are a pair of seal mechanisms provided at both sides of the reaction chamber 1 for passing said sheet material therethrough while maintaining the interior of the reaction chamber 1 under severely reduced pressure. 4 are a plurality of flat type reaction zones (four members in this example) through which the sheet material 2 can be transported continuously by means of a plurality of guide rolls 5. 6 is a vacuum pump attached to the reaction chamber 1 for evacuating the interior thereof. Said reaction zone 4 is provided as shown in FIGS. 2 and 3 respectively with a pair of openings 7 at the upper and the lower ends thereof for passing the sheet material therethrough, and these openings 7 are provided respectively with a seal mechanism (not shown in the figure) such as a lip seal or a labyrinth seal for maintaining the interior of the reaction zone 4 under reduced pressure while allowing the passage of the sheet material 2 therethrough.

As shown in FIGS. 2 and 3, at the central part in each of the reaction zones 4, an electrode for generating low-temperature plasma 8 is provided. 9 is a gas supply pipe for supplying a gas for generating plasma into the interior of the reaction zone 4, and a plurality of gas jet nozzles 10, which are extending along the width direction of the sheet material passing through the reaction zone 4, are attached to the gas supply pipe 9. 11 is a lead wire comprises a shielded wire coming from a high frequency generating device 12 outside of the reaction chamber and connected to the electrode 8 at its coaxial cable part 11a which is covered with a wire netting 11b by putting an insulator such as made of polyethylene therebetween, and said wire netting 11b is connected to the reaction zones 4. The connection of the shielded wire 11 to the electrode 8 in this kind will be described in Example 3 in the following. The reaction chamber 1 and the reaction zones 4 are earthed.

The construction of the apparatus for low-temperature plasma treatment of a sheet material in this example is as above described. Now, its function will be illustrated in the following. In the first place, the vacuum pump 6 is operated for evacuating the reaction chamber 1 including the reaction zones 4 to a reduced pressure of, for instance, about $5 \times 10^{-2}$ Torr. Then, a gas for generating prescribed plasma is supplied from the gas supply pipes 9 into each of the reaction zones 4, and simultaneously high frequency with a frequency of, for instance, 1 KHz to 300 MHz is supplied to the electrodes 8 from the high frequency generating device 12. Thus, low-temperature plasma gas is generated in the reaction zones 4. In passing the sheet material 2 successively through each of the reaction zones 4 as shown in the figure under such a condition, the surface of the sheet material 2 is activated and the low-temperature plasma treatment in object can be done satisfactorily.

According to the apparatus in this example, each of the reaction zones 4 maintained with low-temperature plasma gas is protected in the reaction chamber 1, the reaction chamber 1 lies constantly under reduced pressure in connection with the vacuum pump 6, and the gas for generating plasma is supplied continuously from the gas supply pipes 9 into the reaction zones 4, so that the inner pressure of the reaction zones 4 is always not lower than the inner pressure of the reaction chamber 1 itself. Therefore, there is no danger that each of the interior of the reaction zones 4 is contaminated with the exterior atmosphere (air or by-product gas), and thus the apparatus in this example has a characteristic that the interior of the reaction zones 4 can be kept always with an atmosphere of high quality low-temperature plasma gas constantly and the low-temperature plasma treatment of a sheet material can be done effectively.

Further, since each of the reaction zones 4 is of a small size with a flat shape and is not connected directly to the vacuum pump 6, the contact effect between the sheet material 2 and the low-temperature plasma can be elevated and there is no chance that the plasma gas is abandoned in vain. Therefore, the utilization efficiency of the low-temperature plasma is elevated and the consumption of energy for generating said gas can fully be spared. Moreover, since the electrodes 8 are surrounded respectively with a conductive reaction zone 4 which is earthed in an adjacent state and further said reaction zones 4 are surrounded with the earthed reaction chamber 1, the leakage of high frequency and plasma can be prevented effectively. Consequently low-temperature plasma can surely be generated only in the interior of the reaction zones 4 to elevate the utilization efficiency of the low-temperature plasma generated, and simultaneously the harmful influence of high frequency from outside of the reaction chamber can perfectly be prevented.

By the way, while the construction of the reaction chamber in this example is for the use of continuous treatment of a long sheet material, the reaction chamber may be of a batch-type structure provided with a pair of taking-up chambers of a long sheet material on both sides thereof.

EXAMPLE 2

Figure 4:
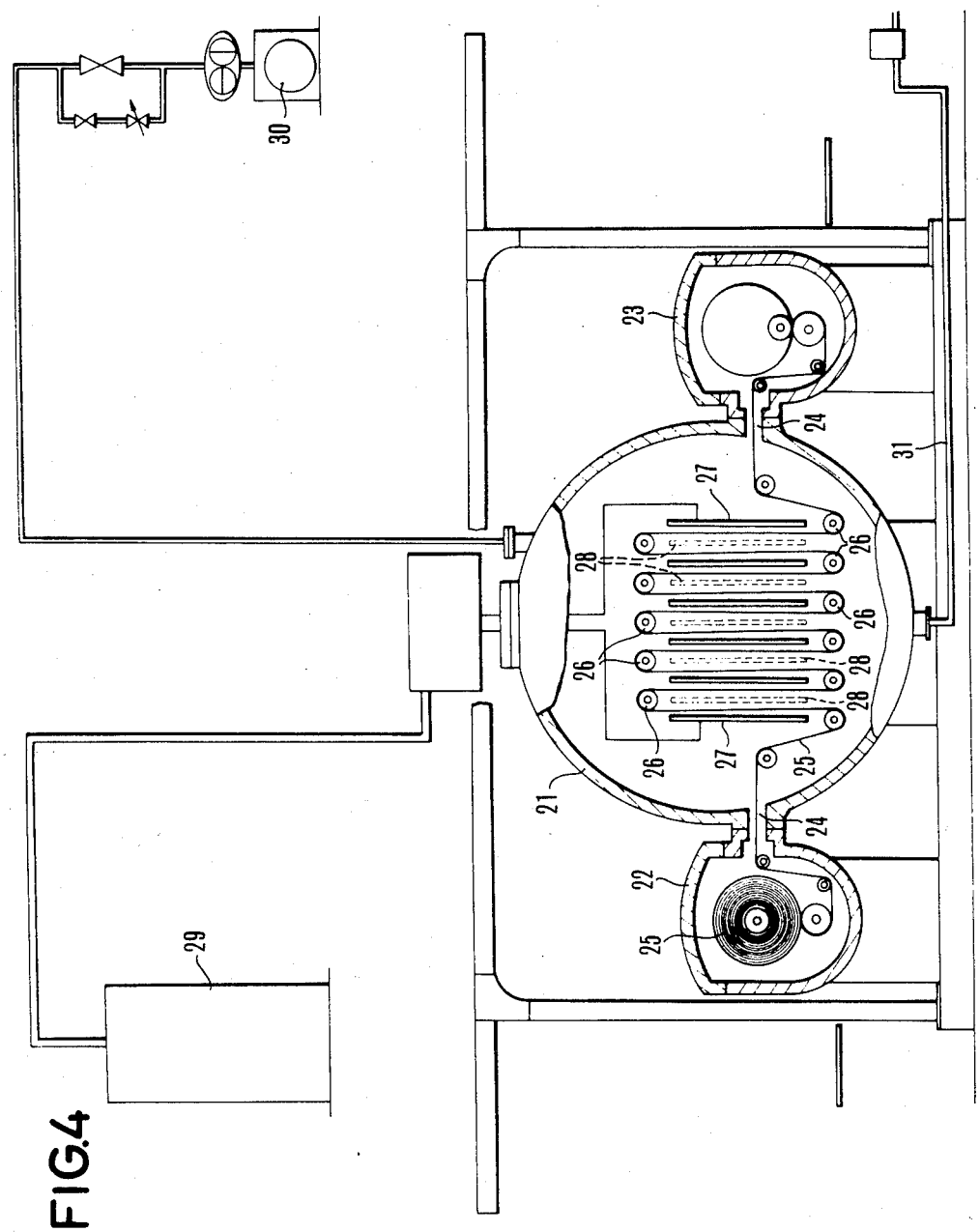
Figure 5:
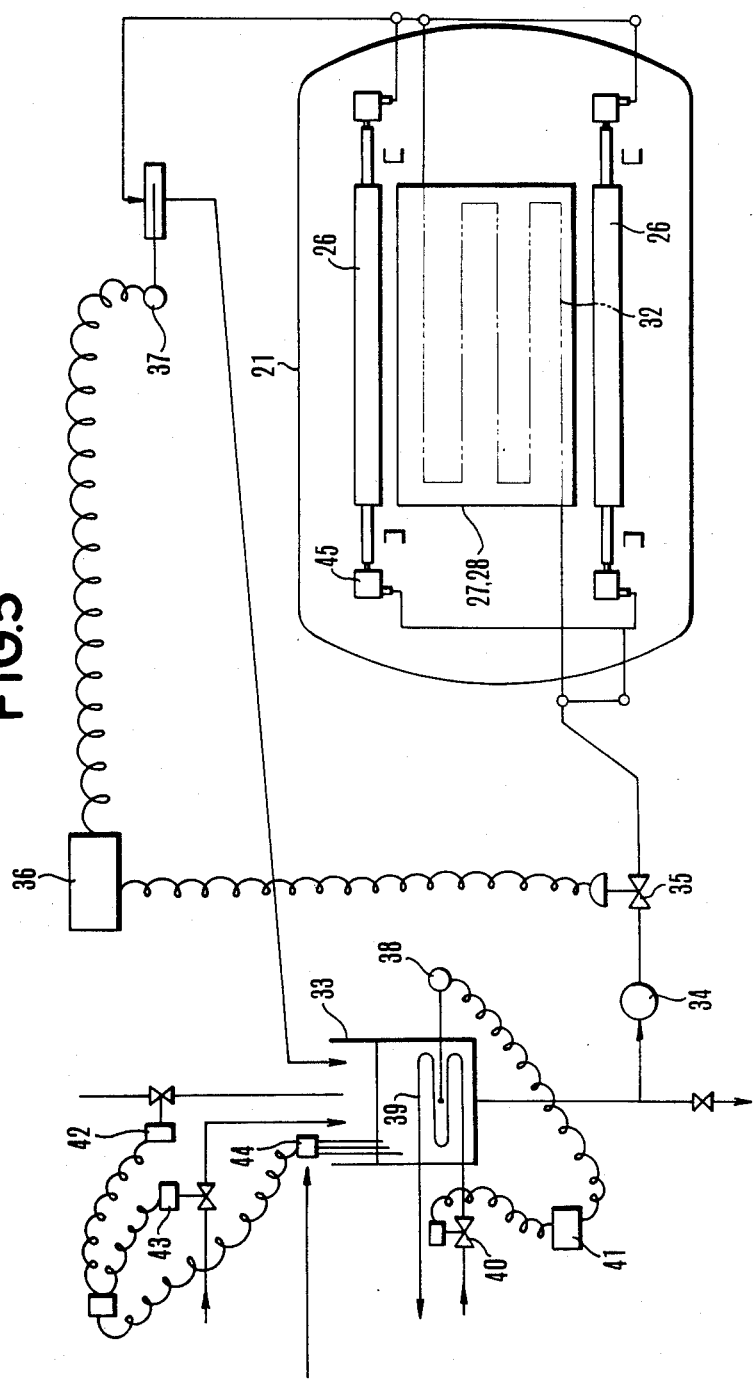
Figure 6:
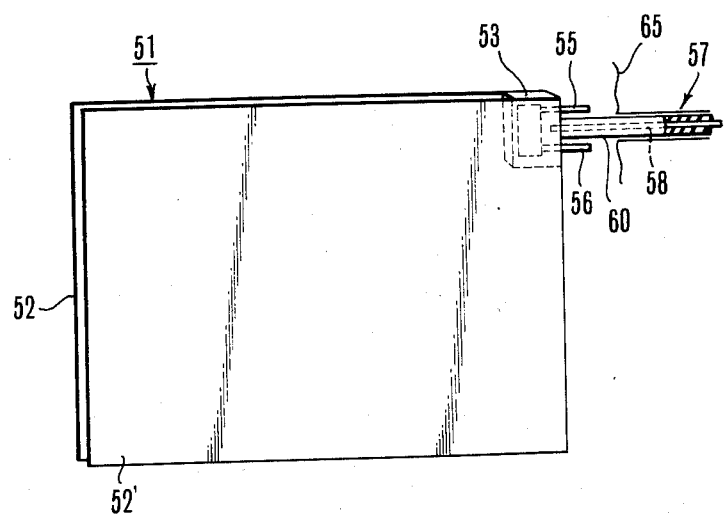
Figure 7:
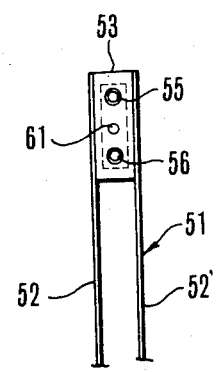
Figure 8:
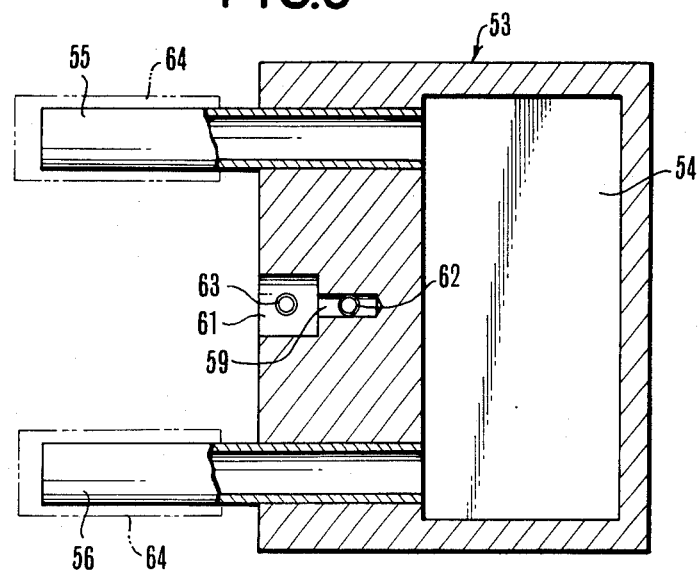
Figure 9:
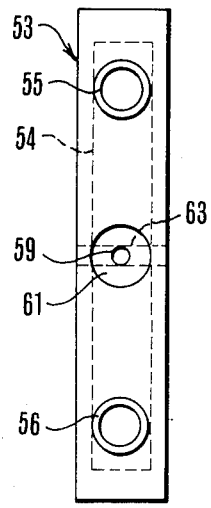

Another example of the present inventive apparatus as shown in FIGS. 4 and 5 is for the use of the low-temperature plasma treatment in batch type. The description will be given for the treatment of a cloth, but the apparatus can also be applicable of the treatment of such materials as other textile products and film materials, and the apparatus may be modified for the use of continuous treatment of a long sheet material.

In FIG. 4, 21 is a batch-type reaction chamber, and 22 and 23 are taking-up chambers of a cloth. The interior of the reaction chamber 21 is communicating to the cloth taking-up chambers 22 and 23 via cloth passages 24 respectively provided at each side of the reaction chamber 21 so as to take up a cloth to be treated, 25, coiled on a reel in one of the taking-up chambers into the other taking-up chamber via the reaction chamber 21. 26 are a plurality of guide rolls provided up and down in two series in the reaction chamber 21 so as to transport the cloth 25 due to the effect of these guide rolls 26 through the reaction chamber 21 zigzag forming snaky undulations.

27 and 28 are a plurality of electrode plates respectively forming a pair provided in adjacent to both sides of the cloth 25 passing through the reaction chamber 21 by means of said guide rolls 26. To the electrode plate groups on one side, for instance the group 27, high frequency is supplied from a high frequency generating device 29, and the other electrode plate group, for instance the group 28, are earthed. 30 is a rotary pump for supplying a gas for generating plasma into the reaction chamber 21, and 31 is an exhaust pipe. The pressure in the interior of the reaction chamber 21 is reduced, for instance, to 0.6–0.7 Torr by driving a vacuum pump (not sown in the figure). Then, a gas for generating plasma such as air, oxygen and the like is supplied via the rotary pump 30 into the reaction chamber 21 in such an extent as to control the vacuum degree in the reaction chamber to about 1 Torr, and high frequency, for instance, with a frequency of 13.56 MHz is supplied from the high frequency generating device 29 to the electrode plates 27 and 28 for generating low-temperature plasma. By transporting the cloth 25 through the space between the electrode plates 27 and 28 under the gas atmosphere excited with the plasma thus generated; the plasma treatment of a cloth in object can be done effectively.

It is desirable that plasma treatment is done uniformly all over the cloth 25 in passing the cloth to be treated 25 through the plasma gas atmosphere, and it is desirable particularly for this purpose, as already stated, that allover the cloth is under a constant temperature. In the present example, therefore, for the purpose to maintain the temperature of the cloth passing through the reaction chamber 21, it is designed so that the temperature of the guide rolls 26 for transporting the cloth and the electrode groups 27 and 28, which are provided on both sides of the cloth passing the cloth therethrough, can be controlled to a prescribed temperature constantly. Namely, said guide rolls 26 are made into a hollow structure and a liquid medium passage with a snaky undulation, 32, for instance as shown in FIG. 5, is attached in contact with the surface of the electrode plates 27 and 28 so as to flow a heating or cooling medium in a liquid medium tank 33 through the interior of the guide rolls 26 and along the electrode plates 27 and 28 by deriving a pump 34.

In FIG. 5, 35 is a flow rate control valve for controlling the flow rate of the heating or cooling medium to the guide rolls 26 and the electrode plates 27 and 28, and this flow rate control valve 35 is operated due to the signal from the first temperature control box 36. 37 is a temperature sensor for measuring the temperature of the liquid medium coming from the guide rolls 26 and the electrode plates 27 and 28, 38 is a liquid temperature sensor for measuring the temperature of the liquid medium in a liquid medium tank 33, 39 is a heat exchanger in the liquid medium tank 33, 40 is a flow rate control valve for the liquid medium passing through the heat exchanger 39, and 41 is a second temperature control box for operating said flow rate control valve 40 based on the signal from the liquid temperature sensor 38. The liquid medium tank 33 is filled with either a cooling medium such as water or a heating medium such as a heated oil selectively according to the circumstances. 42 is an electromagnetic valve for supplying a cooling medium and 43 shows an electromagnetic valve for supplying a heating medium, and these electromagnetic valves 42 and 43 are operated automatically so as to maintain the amount of the heating or cooling medium in the liquid medium tank 33 always to a constant amount due to the signal from a level controller 44. 45 is a rotary joint for passing the liquid medium into the interior of the guide roller 26 with a hollow structure.

The construction of the apparatus for low-temperature plasma treatment of a sheet material such as a cloth in this example is as above described. Now, its function will be illustrated in the following. In the case when it is intended to maintain the temperature of the cloth transported through the reaction chamber 21 constant at a relatively high temperature, for instance at 80° C., the temperature of the first temperature control box 36 is established to 80° C., the temperature of the second temperature control box 41 is established to a temperature higher than the temperature of the first temperature control box, for instance at 90°–100° C., and further the liquid medium tank 33 is filled with a heating medium at a temperature in the range of 90°–100° C. Then, the reaction chamber 21 is operated for generating low-temperature plasma, and simultaneously the guide rolls 26 and the electrode plates 27 and 28 are heated to a prescribed temperature by driving the pump 34 for passing a heating medium through the guide rolls 26 and the electrode plates 27 and 28.

The temperature of the guide rolls 26 and the electrode plates 27 and 28 are controlled to a prescribed temperature by detecting the temperature of the heating medium coming out of the guide rolls and the electrode plates with the use of the temperature sensor 37 and opening or shutting the flow rate control valve 35 automatically based on the temperature of the heating medium thus detected so as to maintain the temperature of the cloth under treatment to a prescribed value. As a result, the cloth 25, which is guided by means of the guide rolls 26 and transported in adjacent to the electrode plates 27 and 28, is eminently treated with low-temperature plasma at a prescribed high temperature, and the characteristic properties of the product such as water absorption property and durability can remarkably be improved in general.

While the cloth is heated in the above embodiment, it is possible inversely to maintain the temperature of the cloth passing through the reaction chamber 21 at low temperature. For instance, when the cloth to be treated comprises polyester fibers, its deep color dyeing can eminently be done in subjecting the cloth to low-temperature plasma treatment by cooling the cloth to the ordinary temperature or below. Further, when the cloth to be treated comprises low melting point fibers such as polypropylene fibers and vinylchloride fibers, there is a danger that the fibers are molten when the temperature of plasma treatment is elevated, deteriorating such properties as the feeling of the cloth produced. Thus, it is desirable in these instances to cool the cloth passing through the reaction chamber 21.

In the case of cooling the cloth, too, similarly as in the preceding case, the temperature of the first temperature control box 36 is established to a temperature of, for instance, 20° C., and the second temperature control box 41 to a temperature lower than the above temperature, for instance 15° C., and further the liquid medium tank 33 is filled with a cooling medium at a temperature of about 15° C. Then the reaction chamber 21 is operated for generating low-temperature plasma, and simultaneously a cooling medium is passed through the guide rolls 26 and the electrode plates 27 and 28 by driving the pump 34. Thus, the guide rolls 26 and the electrode plates 27 and 28 are cooled sufficiently to a prescribed temperature, and consequently, the plasma treatment of the cloth 25 can be done at a sufficiently low temperature satisfactorily.

As above described, by applying the apparatus in this example, it is possible to control the temperature of the cloth to be treated to a desirable prescribed temperature in the course of low-temperature plasma treatment thereof, and therefore, the low-temperature treatment in object can uniformly and effectively be done.

EXAMPLE 3

The example shown in FIGS. 6–9 relates to a feeding device of electric energy to the electrode for generating low-temperature plasma provided in an apparatus for low-temperature plasma treatment of a sheet material such as a cloth and a film as shown in Examples 1 and 2.

In the figures, 51 is an example of the electrode for generating low-temperature plasma comprising two electrode plates 52 and 52' provided in parallel for instance as shown in Example 2. 53 is a shielded wire jointer fixed at one corner of the electrode 51 for connecting a shielded wire 57 to serve as a lead wire to the electrode 51. Said shielded wire jointer 53 is made of an electric conductor such as aluminium and, has a cold water chamber 54 in its interior which is provided with a cold water inlet opening 55 and a cold water outlet opening 56 communicating respectively thereto. The shielded wire jointer 53 is provided further with a connecting hole 59 for putting a lead wire 58 of the shielded wire 57 therein and an inserting hole 61 for putting an insulating layer 60 of the shielded wire 57, for instance, made of polypropylene therein. A screw hole 62 for binding the lead wire 58 therein and a screw hole 63 for binding the insulating layer 60 of the shielded wire 57 therein are provided respectively at the side of said connecting hole 59 and said inserting hole 61. Further, said electrode plates 52 and 52' are fixed to the shielded wire jointer 53 with the use of such a means as welding so as to allow the electrical contact with each other. By the way, 65 is a shielded net for the use of earthing coiled around the outer periphery of the insulating layer 60 of the shielded wire 57.

In applying the feeding device in this example, the lead wire 58 of the shielded wire 57 is connected to the shielded wire jointer 53, and a water pipe 64 made of a highly insulating material such as Teflon is connected respectively to the cooling water inlet opening 55 and the cooling water outlet opening 56 of the cooling water chamber 54 for circulating cold water through the cold water chamber 54. Since the shielded wire jointer 53 is cooled continuously, even when the electrode plates 52 and 52' are heated (for instance up to nearly 100° C.) due to the generation of low-temperature plasma, there is no danger that the shielded wire jointer 53 is heated up even to some extent. Moreover, there is also no danger that the insulating layer 60 of the shielded wire 57 is molten due to heating. Thus, the feeding device in this example has a distinguished effect for increasing the durability of the shielded wire. Similar feeding device may also be applied for another example of the present inventive apparatus for low-temperature plasma treatment of a sheet material such as shown in Example 1.

What is claimed is:

1. An apparatus for low-temperature plasma treatment of a sheet material, comprising:
    an enclosed reaction chamber having an inner pressure reducible by driving of a vacuum pump, said reaction chamber being provided with openings respectively having a seal mechanism on both sides thereof so as to enable taking in and out the sheet material therethrough without leakage;
    a plurality of walled reaction zones provided in said reaction chamber through which the sheet material is transportable, said reaction zones being provided respectively with an electrode connected to a high frequency generating device and a plurality of jet nozzles for supplying a gas for generating low-temperature plasma gas, said reaction chamber and the walls of said reaction zones being earthed; and an electric energy feeding device for the electrodes in the reaction zones, the device including a shielded wire provided so as to lead out of the high frequency generating device, and a shielded wire jointer with cooling mechanism provided so as to electrically connect the electrode to the high frequency generating device said cooling mechanism being provided so as to cool said jointer and said shielded wire.

2. An apparatus for low-temperature plasma treatment of a sheet material, comprising:

an enclosed reaction chamber in which low-temperature plasma is generatable under reduced pressure;

a plurality of guide rolls for transporting the sheet material therethrough;

a plurality of electrode plate pairs arranged on both sides of the sheet material being transported;

a liquid medium passage passing through said guide rolls and said electrode plate pairs for heating and cooling them;

means for controlling the temperature of said guide rolls and said electrode plate pairs to a prescribed temperature by passing a liquid medium through said passage; and an electric energy feeding device for the electrode plate pairs, including a shielded wire provided so as to lead out of a high frequency generating device, and a shielded wire jointer provided so as to electrically connect the electrode plate pairs to the high frequency generating device, said means for controlling the temperature of said electrode plate pairs being connected with said shielded wire jointer so as to cool said jointer and said shielded wire.

* * * * *